United States Patent [19]

Meyer

[11] 4,214,235
[45] Jul. 22, 1980

[54] DIGITAL TO ANALOG CONVERTER USING MULTIPLE EMITTER TRANSISTORS

[75] Inventor: Fritz Meyer, Graefelfing, Fed. Rep. of Germany

[73] Assignee: Siemens Aktiengesellschaft, Berlin & Munich, Fed. Rep. of Germany

[21] Appl. No.: 40,702

[22] Filed: May 21, 1979

[51] Int. Cl.² ............................................ H03K 13/02
[52] U.S. Cl. .......................... 340/347 DA; 307/299 A
[58] Field of Search .... 340/347 M, 347 DA, 347 SY, 340/347 CC; 307/299 A; 325/38 A

[56] References Cited

U.S. PATENT DOCUMENTS 4,118,699  10/1968  Comer ........................ 340/347 DA

FOREIGN PATENT DOCUMENTS 2526798  12/1976  Fed. Rep. of Germany ...... 307/299 A

OTHER PUBLICATIONS

Hart et al., "Electronics", Oct. 3, 1974, pp. 111–118.

Primary Examiner—Charles D. Miller
Attorney, Agent, or Firm—Hill, Van Santen, Steadman, Chiara & Simpson

[57] ABSTRACT

This invention is a circuit for the generation of $2^n$-step digital signals from n-binary signals which are respectively supplied to the input of emitter followers which are connected with a first multi-emitter transistor, whereas inverse binary signals are respectively supplied to the input of another set of emitter followers which are connected to a second multi-emitter transistor. The emitter connections of both multi-emitter transistors are also respectively connected through stepped current sources to an operating potential. The base connections of the multi-emitter transistors are connected to a reference potential through a common resistor. The collector connections of the multi-emitter transistors are connected to load resistors and serve as output connections. The circuit is particularly suited as a binary multi-stage converter for employment in PCM systems of a very high bit rate.

6 Claims, 3 Drawing Figures

DIGITAL TO ANALOG CONVERTER USING MULTIPLE EMITTER TRANSISTORS

BACKGROUND OF THE INVENTION

1. Field of the Invention

The present invention relates to circuits for the generation of step digital signals from binary signals of a very high bit rate.

2. Description of the Prior Art

The optimum use of the capacity of a transmission channel requires adaption of the signal to be transmitted to the signal/noise ratio in the transmission channel and to the band width of the channel. If a coaxial cable is employed as the transmission medium, then the path attenuation is approximately proportional to the square root of the signal frequency. Thus, with increasing transmission band width, the signal/noise ratio decreases quite quickly. The optimum exploitation of a digital signal is possible when the signal is transmitted not in binary form, but rather in the form of a signal with a plurality of amplitude steps, a socalled multi-step signal. As a rule, the number of steps selected for such signals is chosen so that the channel capacity becomes a maximum as the product of the resultant signal/noise ratio and the band width.

Circuits known in the art for the generation of such multi-step signals from binary inputs generally employ the technique of weighted addition, making use with very high bit rate inputs, in the range of at least a few hundred Mbit/s difficult.

Circuits known in the art employing the technique of weighted addition of binary signals encounter special difficulties with binary signal inputs in this range. At such a bit rate, exact weighting becomes difficult and the elimination of feedback so as not to affect the addition is also a problem. Circuits useable with lower bit rates can, therefore, not be readily adapted to use with bit rates in the hundred Mbit/s range.

SUMMARY OF THE INVENTION

A circuit for the generation of digital signals from a high bit binary input with a high degree of accuracy generates $2^2$-step digital signals from n-binary input signals. Such generation is inventively achieved by use of first and second multi-emitter transistors each having n emitter connections. The base connections of the two multi-emitter resistors are connected to a reference potential through a common resistor. The collector connections of each of the multi-emitter transistors are also connected to the reference potential, however, such connections are separately made through respective resistors. The collector connection of the first multi-emitter transistor is connected to an output, and the emitter connections of both multi-emitter transistors are respectively connected both with an operating voltage through a current source, as well as with the output connection of one of n emitter followers connected to the signal inputs. The emitters of the second multi-emitter transistor are also respectively connected to n emitter followers each connected with a signal input. The signal input to the n emitter followers connected to the second multi-emitter transistor is the inverse of the signal connected to the n emitter followers connected with the first multi-emitter transistor.

Each emitter connection of the multi-emitter transistors is respectively connected to a current source which provides a current which is $2^{n-1}$ times an initial current value, where n is the respective number associated with each emitter of the multi-emitter transistors.

A second embodiment of the invention dispenses with transistor current sources and utilizes a series of high ohmic resistors as current sources having resistance values which are stepped in powers of 2.

It is accordingly an object of the present invention to provide a circuit of the type described which combines a very low feedback of input signals with a weighting having minimal imprecision which is useable with binary inputs in any range, including the range of several hundred Mbit/s.

It is another object of the present invention to provide a circuit of the type described which is composed only of transistors and resistors, thereby facilitating production using integrated circuit technology.

Another object of the present invention is to provide a circuit of the type described which is adaptable for use with other logic circuitry in which the most positive potential of the binary input signal is allocated to the logical one state.

DESCRIPTION OF THE PREFERRED EMBODIMENTS

Figure 1:
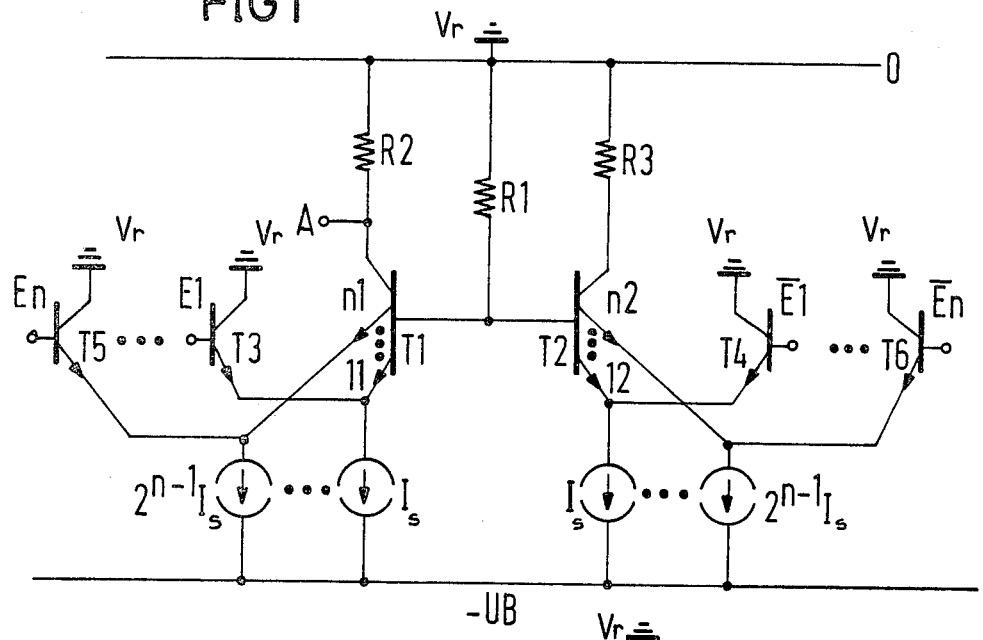
FIG. 1 is a circuit for the generation of $2^n$-step digital signals from n binary input signals constructed in accordance with the principles of the present invention.

A circuit for the generation of $2^n$-step digital signals from n-binary signals is illustrated in FIG. 1. The circuit contains a first multi-emitter transistor T1 and a second multi-emitter transistor T2. The base connections of T1 and T2 are connected, and are connected to a reference voltage $V_r$ through a common resistor R1. The collector of transistor T1 is connected to the reference voltage $V_r$ through a resistor R2, and the collector of the transistor T2 is connected to the reference voltage $V_r$ through a resistor R3.

Each of the multi-emitter transistors T1 and T2 has n emitters. The first emitter connection for transistor T1 is designated 11, and the last emitter connection for transistor T1 is designated n1. The first emitter connection for the transistor T2 is designated 12, and the last emitter connection for that transistor is designated n2.

Each of the n emitters of both transistors T1 and T2 are connected to an operating voltage $-U_B$ through respective current sources. Emitters 11 and 12 are connected to the voltage $-U_B$ through current sources supplying a current $I_s$. Each subsequent emitter of both the transistors T1 and T2 is connected to the operating voltage $-U_B$ through a current source supplying current of a magnitude $2^{n-1}I_s$. This much of the circuit of FIG. 1 represents a base-coupled differential amplifer with current sources.

In addition, each of the emitter connections of both the transistors T1 and T2 are connected to the emitters of preconnected emitter followers, one follower for each emitter of the transistors T1 and T2.

As shown in FIG. 1, the emitter follower associated with the emitter 11 of the transistor T1 is designated T3, and has an input signal E1 supplied to the base of the transistor T3, and a collector connected to the reference voltage $V_r$. The emitter n1 of the transistor T1 is connected to an emitter follower T5 which has an input En supplied to its base, and which also has a collector connected to the reference voltage $V_r$.

Similarly, the emitter 12 of the transistor T2 is connected to an emitter follower T4, which has an input $\overline{E1}$ supplied to its base. The input $\overline{E1}$ is the inverse of the input E1. The collector of the emitter follower T4 is also connected to the reference voltage $V_r$. The emitter n2 of the transistor T2 is connected to an emitter follower T6, which has an input $\overline{En}$ supplied to its base, and a collector connected to the reference voltage $V_r$.

A weighting of the input signals stepped according to powers of 2 is thus produced by means of the current sources $I_s$ through $2^{n-1}I_s$ connected to each emitter. Thus, the first input signal is weighted with $2^0 I_s$ current, or simply $I_s$, and the $n^{th}$ input signal is weighted with the $2^{n-1}I_s$ current. The weighted emitter currents of the two multi-emitter transistors appear at the respective collector connections, reduced by the base current, which in this case is negligible. An output is provided at A from the collector of T1.

Figure 2:
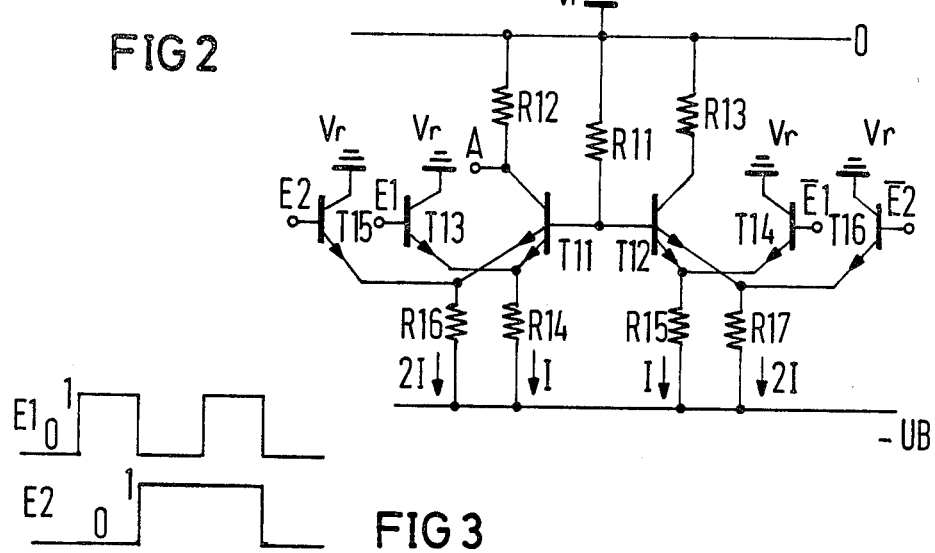
FIG. 2 is an embodiment of the circuit of FIG. 1 for the generation a four-step digital signal from two binary input signals, utilizing resistors for current sources.

A second embodiment of the circuit of FIG. 1 is shown in FIG. 2, utilizing only two binary input signals to form a four-stage output signal which can be utilized as the transmission signal for input to a coaxial cable path. The circuit contains two multi-emitter transistors T11 and T12 connected together in the manner of a base-coupled differential amplifier. The common base connection is connected to a reference voltage $V_r$ through a resistor R11, and the respective collectors of transistors T11 and T12 are connected to the reference voltage $V_r$ through resistors R12 and R13.

Four emitter followers are pre-connected to the emitter connections of the two multi-emitter transistors T11 and T12. The emitter follower T13 has a base input E1, and a collector connected to the reference voltage $V_r$, and the emitter follower T15 has a base input E2, and also has a collector connected to the reference voltage $V_r$.

The emitter follower T14, connected to the emitter of the transistor T12 has a base input $\overline{E1}$ and a collector connected to the reference voltage $V_r$. An emitter follower T16 has a base input $\overline{E2}$ and a collector connected to the reference voltage $V_r$. As in FIG. 1, the inputs $\overline{E1}$ and $\overline{E2}$ are respective inverses of the signals E1 and E2.

In place of the current sources as shown in FIG. 1 which are connected to the emitters of the multi-emitter transistors, the embodiment of FIG. 2 utilizes resistor pairs which are correspondingly dimensioned, designated R14 and R15, and R16 and R17. As an example, the resistors R14 and R15 may have resistance values of 200 ohms, and the resistors R16 and R17 may have resistance values of 100 ohms so that the corresponding emitter currents of I and 2I result. The only requirement is that the resistor values for R16 and R17 be one-half of the values for R14 and R15.

For matching to a coaxial cable connected to an output A, the resistors R12 and R13 may be 75 ohms, and resistor R11 may be 8.7 kohm.

Figure 3:
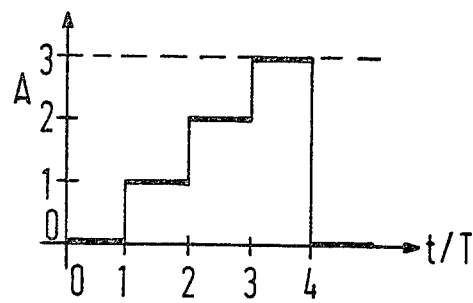
FIG. 3 is a graphic representation of possible inputs for the circuit of FIG. 2, and the corresponding output.

Operation of the circuit of FIG. 2 will be described utilizing the inputs E1 and E2 as graphically shown in FIG. 3. Inputs $\overline{E1}$ and $\overline{E2}$ are not shown in FIG. 3, however, it will be understood that those inputs are simply respective inverses of E1 and E2. It is assumed that the more positive potential in the binary input signals corresponds to the logical one state. The four-step transmission signal can thus assume the values 0, 1, 2 and 3, with the more positive potential allocated to the higher value. As shown in the lower portion of FIG. 3 with the output A plotted on the ordinate and time plotted on the abscissa. For the inputs shown in FIG. 3, operation of the circuit of FIG. 2 is such as to provide an output of 0 Volt for the value 3, and the values 2, 1 and 0 are represented by more negative potentials.

In describing the operation of the circuit of FIG. 2, let it be first assumed that both input signals E1 and E2 are in a logical zero state. Thus, both emitters of the multi-emitter transistor T11 are at a comparatively negative potential, so that both emitters of that transistor are conducting. Because the inputs $\overline{E1}$ and $\overline{E2}$ to emitter followers T14 and T16 are the inverse of signals E1 and E2, both emitters of the multi-emitter transistor T12 are non-conducting.

The currents thus added at the collector of the multi-emitter transistor T11 represent the maximum current through this resistor, so that lowest potential, corresponding to the value logical zero, is generated at the collector resistance R12.

If the input signal level E1 now changes to a logical one value, then the smaller of the two emitter currents of the multi-emitter transistor T11 is blocked. A more positive potential which corresponds to the value logical one then arises at the collector of this transistor. Moreover, an emitter of the multi-emitter transistor T12 is now also conductive, since $\overline{E1}$ is at a value of logical zero. Charges in the base zone of the transistor T11 allocated to the current I are directly transmitted to the base zone of the transistor T12 upon this change-over process, so that there follows a very quick change-over of the current from one emitter of the transistor T11 to the corresponding emitter of the transistor T12. This quick change-over of the emitter currents is made possible by the fact that saturation of the transistors T12 and T11 is avoided.

If, after a change-over of the input signals, the first input signal E1 is at the value logical zero and the second input signal E2 is at the value logical one, then the larger emitter current of the transistor T11 is transmitted to the transistor T12. The potential at the collector at the transistor T11, in contrast to the preceding case, now becomes more positive and the value logical two occurs at the output.

If both input signals are at the value logical one, then the transistor T11 is completely non-conducting and the potential at the collector connection of this transistor now has its most positive value corresponding to an output signal of a value logical three.

For the compensation of varying amplification properties which may result if the multi-emitter transistors have not been specially selected, it is possible to reduce or increase the emitter resistors serving as current sources as may be required. It is also possible to tap the inverse output signal from the collector connection of the second multi-emitter transistor, T2 or T12, for driving further symmetrical differential amplifiers.

Although modifications and changes may be suggested by those skilled in the art, it is the intention of the inventor to embody within the patent warranted hereon all changes and modifications as reasonably and properly come within the scope of the inventor's contribution to the art.

I claim as my invention:

1. A circuit for the generation of $2^n$-step digital signals from n-binary signals of a very high bit rate comprising:
   a base-coupled differential amplifier having first and second multi-emitter transistors each having n emitters respectively connected to n emitter follower transistors having base signal inputs, with emitter follower transistors connected to said second multi-emitter transistor having base signal inputs which are the inverse of the base signal inputs for corresponding ones of said emitter follower transistors connected to said first multi-emitter transistor;
   two sets of n current sources respectively associated with each multi-emitter transistor, one current source interconnected between each multi-emitter transistor-emitter follower transistor connection and an operating potential, and each set providing currents which are $2^{n-1}$ times an initial current value with a lowest-value current source from each set respectively connected to a first emitter of each multi-emitter transistor and the remainder of said current sources respectively connected to corresponding emitters of said first and second multi-emitter transistors; and
   an output tap connected to the collector of said first multi-emitter transistor.

2. The circuit of claim 1 wherein each current source set is comprised of n resistors having respective resistances which are $2^{n-1}$ times an initial resistor value.

3. The circuit of claim 1 wherein a logical one condition is allocated to the more positive potential of the binary input signals.

4. A circuit for generating $2^n$-step digital signals from n-binary signals of a very high bit rate comprising:
   a source of reference potential;
   a source of operating potential;
   first and second multi-emitter transistors each having n emitters and having their respective bases connected to said reference potential through a common first resistor, and having their respective collectors separately connected to said reference potential through respective second and third resistors, and said collector of said first multi-emitter transistor tapped for output;
   2n emitter follower transistors, each having an emitter connected to a respective one of said first and second multi-emitter transistor emitters, each having a collector connected to said reference potential, and emitter follower transistors which are connected to said first multi-emitter transistor receiving one of a first set of n input signals at their respective bases, and emitter follower transistors which are connected to said second multi-emitter transistor receiving one of a second set of n input signals at their respective bases which is the inverse of said first input signal set;
   two sets of n current sources respectively associated with each multi-emitter transistor, one current source interconnected between each multi-emitter transistor-emitter follower transistor connection and said operating potential, and each set providing currents which are $2^{n-1}$ times an initial current value, with a lowest-value current source from each set respectively connected to a first emitter of each multi-emitter transistor and the remainder of said current sources respectively connected to corresponding emitters of said first and second multi-emitter transistors.

5. The circuit of claim 4 wherein each current source set is comprised of n resistors having respective resistances which are $2^{n-1}$ times an initial resistor value.

6. The circuit of claim 4 wherein a logical one condition is allocated to the more positive potential of the binary input signals.

* * * * *